(12) United States Patent
Mabuchi

(10) Patent No.: US 8,084,837 B2
(45) Date of Patent: Dec. 27, 2011

(54) SOLID-STATE IMAGE PICKUP DEVICE

(75) Inventor: Keiji Mabuchi, Kanagawa (JP)

(73) Assignee: Sony Corporation, Tokyo (JP)

( * ) Notice: Subject to any disclaimer, the term of this patent is extended or adjusted under 35 U.S.C. 154(b) by 0 days.

(21) Appl. No.: 12/762,997

(22) Filed: Apr. 19, 2010

(65) Prior Publication Data

US 2010/0194950 A1    Aug. 5, 2010

Related U.S. Application Data

(63) Continuation of application No. 10/440,683, filed on May 19, 2003, now Pat. No. 7,701,029.

(30) Foreign Application Priority Data

May 20, 2002   (JP) ................................. 2002-144886

(51) Int. Cl.
     *H01L 31/102*      (2006.01)
(52) U.S. Cl. ........ 257/463; 257/227; 257/228; 257/292; 257/E31.053; 348/294
(58) Field of Classification Search .................. 257/225, 257/227, 228, 290, 291, 292, 431, 436, 447, 257/460, 461, 462, 463, 464, E31.053, E31.11, 257/E31.124, E31.126; 348/294
See application file for complete search history.

(56) References Cited

U.S. PATENT DOCUMENTS

| 4,242,695 | A | 12/1980 | Ouchi et al. | |
|---|---|---|---|---|
| 5,005,063 | A | 4/1991 | Janesick | |
| 6,465,862 | B1 * | 10/2002 | Harris | 257/463 |
| 6,683,360 | B1 * | 1/2004 | Dierickx | 257/428 |
| 6,924,541 | B2 | 8/2005 | Yoneda et al. | |

FOREIGN PATENT DOCUMENTS

| JP | 58-094281 | 6/1983 |
|---|---|---|
| JP | 58094281 | 6/1983 |
| JP | 01-274468 | 11/1989 |
| JP | 05-136451 | 6/1993 |
| JP | 09-045886 | 2/1997 |
| JP | 2000-156491 | 6/2000 |
| JP | 2001-078098 | 3/2001 |
| JP | 2003-273343 | 9/2003 |

* cited by examiner

*Primary Examiner* — Evan Pert
*Assistant Examiner* — Eduardo A Rodela
(74) *Attorney, Agent, or Firm* — Rader, Fishman & Grauer PLLC

(57) ABSTRACT

In a rear surface incidence type CMOS image sensor having a wiring layer 720 on a first surface (front surface) of an epitaxial substrate 710 in which a photodiode, a reading circuit (an n-type region 750 and an n+ type region 760) and the like are disposed, and a light receiving plane in a second surface (rear surface), the photodiode and a P-type well region 740 on the periphery of the photodiode are disposed in a layer structure that does not reach the rear surface (light receiving surface) of the substrate, and an electric field is formed within the substrate 710 to properly lead electrons entering from the rear surface (light receiving surface) of the substrate to the photodiode. The electric field is realized by providing a concentration gradient in a direction of depth of the epitaxial substrate 710. Alternatively, the electric field can be realized by providing a rear-surface electrode 810 or 840 for sending a current.

15 Claims, 12 Drawing Sheets

TO S/H AND CDS

SOLID-STATE IMAGE PICKUP DEVICE

The subject matter of application Ser. No. 10/440,683, is incorporated herein by reference. The present application is a Continuation of U.S. Ser. No. 10/440,683, filed May 19, 2003, which claims priority to previously filed Japanese patent application number P2002-144886 filed on May 20, 2002, in JAPAN which is incorporated herein by reference.

BACKGROUND OF THE INVENTION

The present invention relates generally to a solid-state image pickup device for use as various image sensors and camera modules.

DESCRIPTION OF THE RELATED ART

Recently, video cameras and electronic cameras have achieved tremendous commercial success. These cameras typically use a CCD type or an amplification type solid-state image pickup device.

Of the conventional solid-state image pickup devices, the amplification type solid-state image pickup device (CMOS image sensor) includes, on a single semiconductor chip, an image pickup pixel unit formed by arranging a plurality of pixels two-dimensionally and a peripheral circuit unit disposed on the outside of the image pickup pixel unit.

Each of the pixels of the image pickup pixel unit includes an FD part and various MOS transistors for transfer, amplification and the like. A photodiode receives light incident on each pixel and performs photoelectric conversion to thereby generate signal charge. The transfer transistor transfers the signal charge to the FD part. The amplification transistor detects variation in potential of the FD part, and then converts and amplifies the variation in potential of the FD part into an electric signal. Thereby the signal of each pixel is output through a signal line to the peripheral circuit unit.

The peripheral circuit unit includes: a signal processing circuit for subjecting the pixel signal from the image pickup pixel unit to predetermined signal processing such for example as CDS (Correlated Double Sampling), gain control, A/D conversion and the like; and a driving control circuit for driving each of the pixels of the image pickup pixel unit and controlling the output of the pixel signal, such as, for example, a vertical and a horizontal scanner and a timing generator (TG).

FIG. 11 is a sectional view of a device structure in a conventional CMOS image sensor, showing the structure of one pixel 10 of the image pickup pixel unit and one MOS transistor 20 provided in the peripheral circuit unit.

The pixel 10 of the image pickup pixel unit has a P-type well region 11 on an N-type silicon substrate 1, and a photodiode 12 and an FD part 13 in the P-type well region 11. An upper insulating layer 2 on the N-type silicon substrate 1 includes: a polysilicon transfer electrode 14 for a transfer gate for transferring signal charge from the photodiode 12 to the FD part 13; metal wiring 15 and 16 of aluminum or the like in a higher layer than that of the polysilicon transfer electrode 14; and a light shield film 17 having an opening for the photodiode 12 to receive light in a layer higher than that of the metal wiring 15 and 16.

A passivation film 3 formed by a silicon nitride film or the like is provided on the upper insulating layer 2, and an on-chip color filter 18 and an on-chip microlens 19 are provided on the passivation film 3.

The MOS transistor 20 of the peripheral circuit unit has a P-type well region 21 on the N-type silicon substrate 1, and a source region 22 and a drain region 23 in the P-type well region 21. The upper insulating layer 2 on the N-type silicon substrate 1 includes: a polysilicon gate electrode 24 of the MOS transistor 20; metal wiring 25, 26, and 27 of aluminum or the like in a higher layer than that of the polysilicon gate electrode 24; and metal wiring 28 of aluminum or the like in the passivation film 3 higher than that of the metal wiring 25, 26, and 27.

In each pixel of the solid-state image pickup device with such a composition, for a higher aperture ratio of the photodiode 12 (ratio of light incident on the photodiode 12 to light incident on the pixel), the microlens 19 condenses incident light on the photodiode 12 through a space between the pieces of wiring.

In this case, however, a part of the light condensed by the microlens 19 is reflected by the wiring 15 and 16. This causes the following problems.

1) The reflection by the wiring of the part of the light condensed by the microlens 19 correspondingly lowers sensitivity.

2) A part of the light reflected by the wiring enters a photodiode of an adjacent pixel, resulting in color mixing.

3) Since wiring layout is limited, limitations in that wiring cannot be placed over the photodiode or thick wiring cannot be routed degrade characteristics.

4) Size reduction is difficult for the same reason as in 3).

5) Light obliquely enters a pixel in a peripheral portion and is therefore reflected at a higher rate, resulting in darker shading in the peripheral portion.

6) When the CMOS image sensor is to be produced by an advanced CMOS process involving more wiring layers, a distance from the microlens to the photodiode is increased, which aggravates the difficulties as described above.

7) As a result of 6), a library of the advanced CMOS processes cannot be utilized. Laying out again of circuits registered in the library, increase in area due to limitations on the wiring layers or the like results in increased cost. Also, pixel area per pixel is increased.

In addition, when light of long wavelength such as red light is subjected to photoelectric conversion in the P-type well region 11 at a position deeper than that of the photodiode 12, resulting electrons diffuse in the P-type well region 11 and then enter a photodiode 12 in a different position, thus causing color mixing. When the electrons enter a pixel shielded from light for black detection, a black level is erroneously detected.

Furthermore, there is a process using silicide in the active region. Since silicide blocks incidence of light, it is necessary to add a process of removing only silicide over the photodiode 12. This increases and complicates process steps. A defect in the photodiode is also caused by the process steps.

As described above, the peripheral circuit unit of the CMOS image sensor has functions of a camera signal processing circuit, a DSP and the like, which have previously been formed on a different chip. As their process generation is advanced from 0.4„m to 0.25„m to 0.18„m to 0.13„m, if the CMOS image sensor itself is not adapted to these new processes, the benefits of the finer processes cannot be gained, and abundant CMOS circuit libraries and IPs cannot be used.

With the advance of the process generation, however, the layers of the wiring structure have been increased in number. For example, the 0.4„m process uses three layers of wiring, whereas the 0.13„m process uses eight layers of wiring. Also, thickness of the wiring is increased, and hence the distance from the microlens to the light receiving plane of the photodiode is increased three to five times.

Thus, with the conventional method of passing light through wiring layers to the light receiving plane, light cannot be condensed on the light receiving plane of the pixel efficiently, and the problems of 1) to 7) are more noticeable.

Accordingly, in view of the conventional problems as described above, the present applicant has proposed a method of fabricating a solid-state image pickup device applicable to a rear surface incidence type CMOS image sensor (see Japanese Patent Application No. 2002-76081, for example). According to this proposition (hereinafter referred to as a prior application), a wiring layer is provided on a first surface (front surface) of a semiconductor substrate in which a photodiode as an image pickup element and the like are disposed, and a light receiving plane of the photodiode is provided in a second surface (rear surface).

A constitution of the solid-state image pickup device according to the prior application will now be described.

FIG. 12 is a sectional view of a device structure in a rear surface incidence type CMOS image sensor according to the prior application, showing a structure of one pixel 400 of an image pickup pixel unit and one MOS transistor 500 provided in a peripheral circuit unit. In FIG. 12, an upper part is an incidence plane (rear surface) side and a lower part is a wiring plane (front surface) side.

The CMOS image sensor has three layers of metal wiring 330, 340, and 350 as described above within a silicon oxide film layer 610, which is provided on a substrate supporting material (glass resin or the like) 600. A silicon layer (N-type silicon substrate) 620 provided on the silicon oxide film layer 610 includes the pixel 400 and the MOS transistor 500 described above.

The pixel 400 is formed by providing a photodiode 420 in a state of penetrating the silicon layer 620 at a portion intermediate between P-type well regions 410A and 410B formed in a state of penetrating the silicon layer 620. An FD part 210 as described above is provided in one P-type well region 410A. A transfer gate electrode 312 as described above is provided within the silicon oxide film layer 610 at a position intermediate between the photodiode 420 and the FD part 210.

The MOS transistor 500 is formed by providing a P-type well region 510 in a region of the N-type silicon layer 620 on the side of the silicon oxide film layer 610, providing a source/drain (S/D) 520A and 520B in the P-type well region 510, and providing a gate electrode (polysilicon film) 530 on a side of the silicon oxide film layer 610.

A P+ type region 630 is provided on the N-type silicon layer 620, and a silicon oxide film (SiO2) 640 is provided on the P+ type region 630. Further, a light shield film 650 of aluminum or the like is provided on the silicon oxide film 640. The light shield film 650 has an opening 650A corresponding to a light receiving region of the photodiode 420.

Though not shown, a pixel for detecting a black level is formed in a device structure similar to that of the pixel 400 shown in FIG. 12. However, the opening 650A of the light shield film 650 is not formed in a light receiving region of the pixel for detecting a black level. Thus the pixel outputs signal charge as a black level reference signal without receiving light.

A silicon nitride film (SiN) 660 as a passivation layer is provided on the light shield film 650. Further, on the silicon nitride film 660, a color filter 670 and a microlens 680 are disposed in an on-chip structure in a region corresponding to the image pickup pixel unit.

A wafer forming such a CMOS image sensor is polished by CMP (Chemical Mechanical Polishing) so that the silicon layer 620 has a film thickness of about 10„m, for example.

From a viewpoint of light frequency characteristics, desirable film thickness ranges from 5„m to 15„m for visible light, from 15„m to 50„m for infrared light, and from 3„m to 7„m for an ultraviolet region.

Unlike wiring, the light shield film 650 can be laid out with only optical factors being considered. Only the light shield film 650 forms a metal layer in a region from the microlens 680 to the photodiode 420. In addition, height of the light shield film 650 from the photodiode 420 is low at about 0.5„m, for example, which is thickness of the silicon oxide film 640. Hence, unlike the foregoing conventional example, limitation on light condensation due to reflection by metal wiring can be eliminated.

In such a solid-state image pickup device, a light receiving surface of the photodiode is formed by polishing the rear surface side of the semiconductor substrate. In this case, it is desirable that the P-type well regions where each device of the image pickup pixel unit is formed reach the polished rear surface of the semiconductor substrate and that there be no P-type well region under (on the light receiving surface side) of the photodiode.

For stable polishing of the semiconductor, however, a thickness of 10„m or more including a margin is desirable. Also from a viewpoint of sensitivity to red light, a substrate thickness on this order is desirable.

Thus, as shown in FIG. 12, for example, the P-type well regions 410A and 410B need to be formed in a state of penetrating the silicon layer 620 having a film thickness of 10„m or more. However, the forming of the P-type well regions to a depth of 10„m or more in the semiconductor substrate has a problem in that it requires advanced fabrication technology.

There is also a demand for a smaller area a few „m square or less for the photodiode in correspondence with smaller size of the image pickup device chip. In this case, the photodiode becomes very long and narrow in a direction of depth of the semiconductor substrate, thus requiring a process of forming a longer and narrower photodiode 420 as shown in FIG. 12, for example. Therefore advanced fabrication technology is required also in this case.

Incidentally, even when the P-type well regions of the image pickup pixel unit are formed so as not to reach the rear surface side of the semiconductor substrate, operation itself of the solid-state image pickup device is possible. However, electrons generated by photoelectric conversion in a shallow region on incidence of light on the rear surface of the semiconductor substrate, for example, do not necessarily enter the nearest photodiode, diffusing and entering another photodiode. This causes problems of color mixing and decrease in resolution.

It is accordingly one object of the present invention to provide a solid-state image pickup device and a method of fabricating the same that make it possible to prevent color mixing and decrease in resolution while ensuring stable fabrication by using a shallow P-type well region in a rear surface incidence type solid-state image pickup device. Other objects and advantages of the present invention will be apparent in light of the following Summary and Detailed Description thereof.

SUMMARY OF THE INVENTION

In order to achieve the above object, according to the present invention, there is provided a solid-state image pickup device characterized by comprising: a semiconductor substrate having an image pickup pixel unit formed by arranging a plurality of pixels each including a photoelectric converting device and a reading circuit therefor in a two-dimensional array; a wiring layer formed by stacking a plurality of layers of wiring including a signal line for driving the image pickup pixel unit on a first surface of the semiconductor substrate, a second surface of the semiconductor substrate being formed as a light receiving plane for the photoelectric converting device; and electric field generating means for generating an electric field in the semiconductor substrate in a direction of depth of the semiconductor substrate and thereby leading photoelectrons entering from the light receiving plane of the semiconductor substrate to the photoelectric converting device formed on a first surface side of the semiconductor substrate.

Further, according to the present invention, there is provided a method of fabricating a solid-state image pickup device, the solid-state image pickup device including: a semiconductor substrate having an image pickup pixel unit formed by arranging a plurality of pixels each including a photoelectric converting device and a reading circuit therefor in a two-dimensional array; and a wiring layer formed by stacking a plurality of layers of wiring including a signal line for driving the image pickup pixel unit on a first surface of the semiconductor substrate, a second surface of the semiconductor substrate being formed as a light receiving plane for the photoelectric converting device, the method characterized by comprising: a substrate forming step for providing electric field generating means for generating an electric field in the semiconductor substrate in a direction of depth of the semiconductor substrate and thereby leading photoelectrons entering from the light receiving plane of the semiconductor substrate to the photoelectric converting device formed on a first surface side of the semiconductor substrate.

With the solid-state image pickup device and the method of fabricating the same according to the present invention, the electric field generating means is provided which generates an electric field in the semiconductor substrate in the direction of depth of the semiconductor substrate and thereby leads photoelectrons entering from the second surface (light receiving plane) of the semiconductor substrate to the photoelectric converting device formed on the first surface side of the semiconductor substrate. Therefore, even when the photoelectric converting device and a well region are formed in a shallow region on the first surface side of the semiconductor substrate, photons entering from the second surface of the semiconductor substrate can be effectively led to the photoelectric converting device. It is thereby possible to control decrease in sensitivity and color mixing.

Thus, the thickness of the semiconductor substrate does not need to coincide with the depth of the photoelectric converting device and the well region, the semiconductor substrate can therefore be formed with proper thickness, and the photoelectric converting device and the well region can be formed easily. It is thereby possible to provide a rear surface incidence type solid-state image pickup device that is simple and low in cost.

BRIEF DESCRIPTION OF THE DRAWINGS

FIG. 9 is a sectional view of assistance in explaining a method of mounting the CMOS image sensor shown in FIG. 7 and FIG. 8 in a package or the like;

DESCRIPTION OF THE PREFERRED EMBODIMENTS

A preferred embodiment of a solid-state image pickup device and a method of fabricating the same according to the present invention will hereinafter be described.

The solid-state image pickup device according to the present embodiment is a rear surface incidence type CMOS image sensor having a wiring layer on a first surface of a semiconductor substrate (device forming layer) where a photodiode, a reading circuit and the like are disposed, and a light receiving plane in a second surface. In the rear surface incidence type CMOS image sensor, the photodiode and a P-type well region on the periphery of the photodiode are disposed in a layer structure that does not reach the rear surface (light receiving surface) of the substrate, and an electric field is formed within the substrate to properly lead electrons entering from the rear surface (light receiving surface) of the substrate to the photodiode.

That is, even with the layer structure with a distance between the light receiving surface at the rear surface of the substrate and the photodiode and the P-type well region, the electrons entering from the rear surface of the substrate are effectively advanced by leading power of the electric field within a silicon layer and effectively led to the photodiode corresponding to an incidence region of each pixel, whereby the electrons are prevented from being dispersed to adjacent pixels.

Thereby, the need for forming the photodiode and the P-type well region that have the same film thickness as the semiconductor substrate can be eliminated. The semiconductor substrate can be formed with adequate film thickness, and difficulty in manufacturing technology of fabricating an extremely thin semiconductor substrate is eliminated. Also, it suffices to form the photodiode and the P-type well region in a shallow region of the substrate. Thus fabricating operation can be simplified.

As an example of a method of forming an electric field within the semiconductor substrate, a concentration gradient is provided in advance in a direction of depth of the substrate, whereby an electric field is formed in a fixed manner, or an electrode of negative potential is provided on the rear surface of the substrate, so that an electric field can be formed through passage of a current.

Further, it is desirable that a region from the rear surface (the light receiving surface=the second surface) of the semiconductor substrate to ½ or more of the depth of the semiconductor substrate, for example, occur as a region for generating the electric field.

An outline of the CMOS image sensor in the present embodiment will be described.

Figure 1:
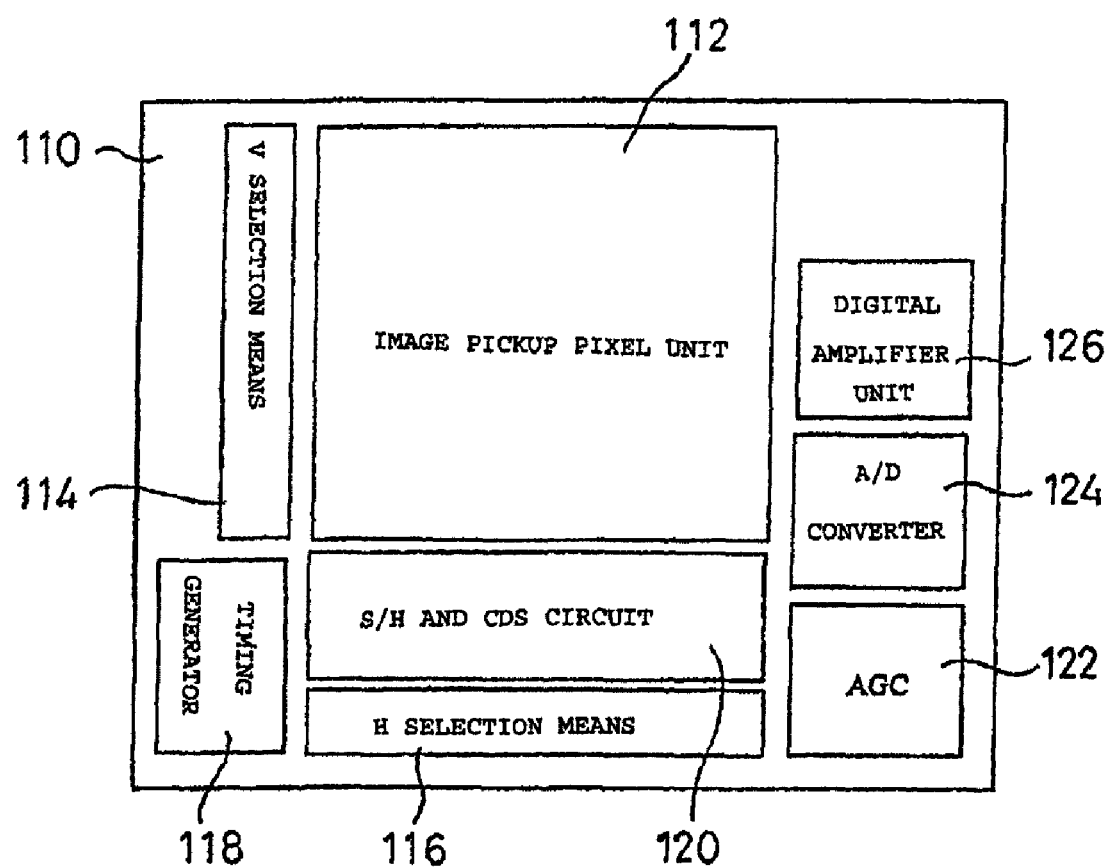
FIG. 1 is a schematic plan view of an outline of a CMOS image sensor according to an embodiment of the present invention.
Figure 2:
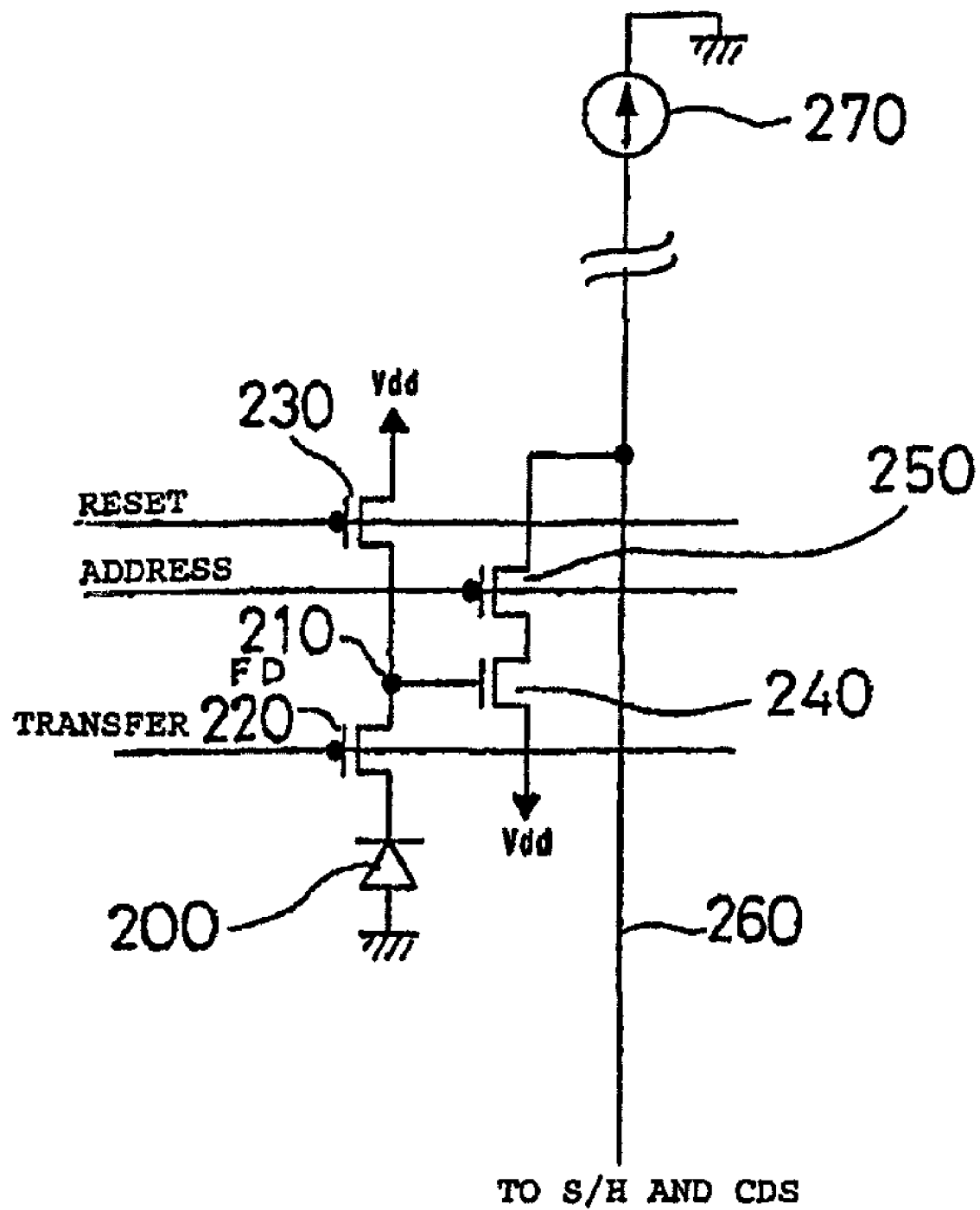
FIG. 2 is an equivalent circuit diagram showing a configuration of a pixel of the CMOS image sensor shown in FIG. 1.

FIG. 1 is a schematic plan view of an outline of the CMOS image sensor according to the embodiment of the present invention. FIG. 2 is an equivalent circuit diagram showing a configuration of a pixel of the CMOS image sensor shown in FIG. 1.

The CMOS image sensor according to the present embodiment includes, on a semiconductor chip 110: an image pickup pixel unit 112; V (Vertical) selection means 114; H(Horizontal) selection means 116; a timing generator (TG) 118; an S/H(Sample and Hold) and CDS unit 120; an AGC (Auto Gain Control) unit 122; an A/D (Analog Digital Conversion) unit 124; a digital amplifier unit 126; and the like.

The image pickup pixel unit 112 has a large number of pixels arranged in a form of a two-dimensional matrix. As shown in FIG. 2, each of the pixels includes a photodiode (PD) 200 serving as a photoelectric converting device for generating a signal charge corresponding to an amount of light received and storing the signal charge, and four MOS transistors: a transfer transistor 220 for transferring the signal charge converted and stored by the photodiode 200 to a floating diffusion part (FD part) 210; a reset transistor 230 for resetting voltage of the FD part 210; an amplifying transistor 240 for outputting an output signal corresponding to the voltage of the FD part 210; and a selecting (address) transistor 250 for outputting the output signal of the amplifying transistor 240 to a vertical signal line 260.

In the pixel having such a configuration, the transfer transistor 220 transfers the signal charge obtained by photoelectric conversion by the photodiode 200 to the FD part 210. The FD part 210 is connected to a gate of the amplifying transistor 240. The amplifying transistor 240 forms a source follower with a constant-current source 270 provided externally of the image pickup pixel unit 112. Hence, when the address transistor 250 is turned on, a voltage corresponding to the voltage of the FD part 210 is outputted to the vertical signal line 260.

The reset transistor 230 resets the voltage of the FD part 210 to a fixed voltage (driving voltage Vdd in the example shown in FIG. 2) independent of the signal charge.

The image pickup pixel unit 112 has various driving wiring arranged in a horizontal direction for driving and controlling the MOS transistors. The V selection means 114 sequentially selects the pixels of the image pickup pixel unit 112 in a vertical direction in a unit of a horizontal line (pixel row). The MOS transistors of each pixel are controlled by various pulse signals from the timing generator 118. Thereby a signal of each pixel is output to the S/H and CDS unit 120 through the vertical signal line 260 in each pixel column.

The S/H and CDS unit 120 is formed by providing an S/H and CDS circuit for each pixel column of the image pickup pixel unit 112. The S/H and CDS unit 120 subjects the pixel signal outputted from each pixel column of the image pickup pixel unit 112 to signal processing such as CDS (Correlated Double Sampling) and the like. The H selection means 116 outputs the pixel signal from the S/H and CDS unit 120 to the AGC unit 122.

The AGC unit 122 effects predetermined gain control on the pixel signal from the S/H and CDS unit 120 selected by the H selection means 116, and then outputs the pixel signal to the A/D unit 124.

The A/D unit 124 converts the pixel signal from the AGC unit 122 from an analog signal to a digital signal, and then outputs the digital signal to the digital amplifier 126. The digital amplifier 126 performs necessary amplification and buffering of the digital signal output from the A/D unit 124 for output from an external terminal not shown.

The timing generator 118 also supplies various timing signals to parts other than each pixel of the image pickup pixel unit 112 as described above.

Figure 3:
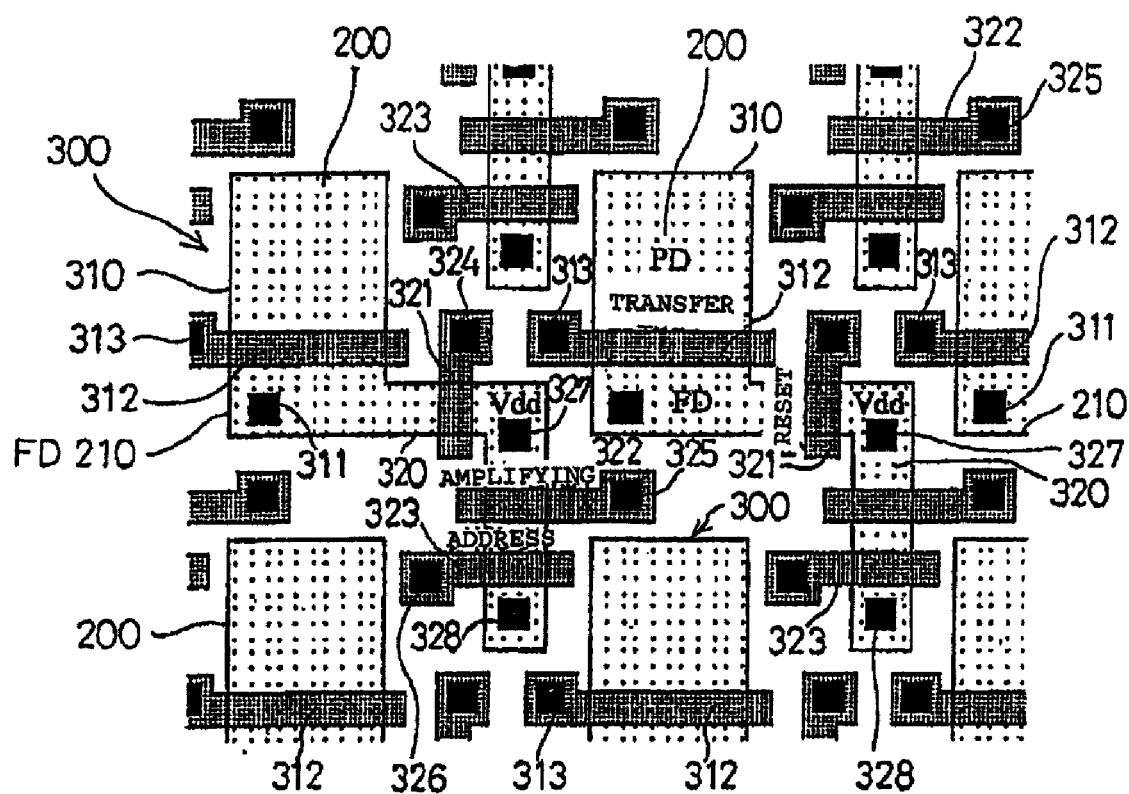
FIG. 3 is a schematic plan view of a concrete example of a pixel layout of the CMOS image sensor shown in FIG. 1.
Figure 4:
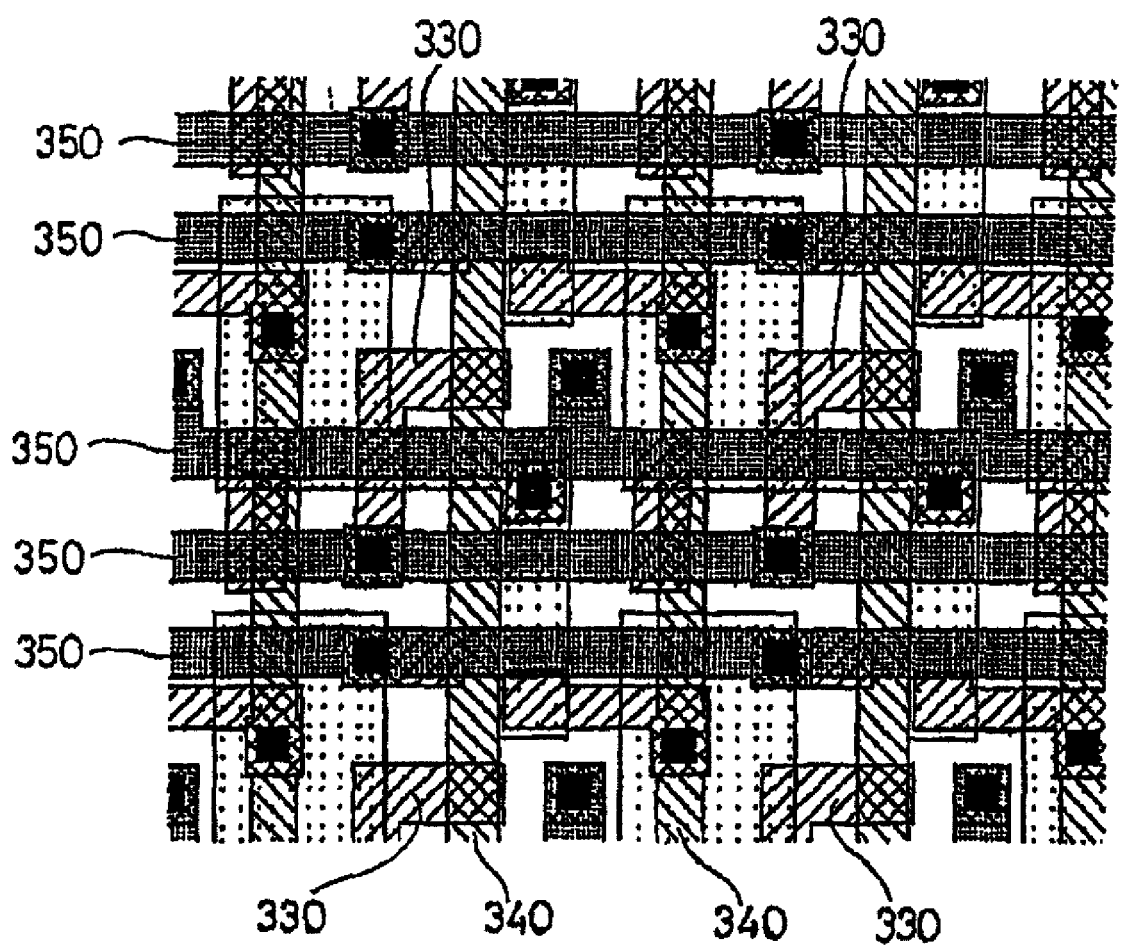
FIG. 4 is a schematic plan view of a concrete example of a pixel layout of the CMOS image sensor shown in FIG. 1.

FIG. 3 and FIG. 4 are schematic plan views of a specific example of a pixel layout of the CMOS image sensor according to the present embodiment. First, FIG. 3 shows an arrangement of photodiodes, active regions of transistors (regions where gate oxide film is disposed), gate electrodes (polysilicon films), and contacts therewith. As shown in FIG. 3, an active region 300 of each pixel is formed by a rectangular region 310 including the photodiode (PD) 200 and the FD part 210 as described above, and a bent band-shaped region 320 extending from one corner of the rectangular region 310 in a shape of an L.

The FD part 210 in the rectangular region 310 is provided with a contact 311. A transfer gate electrode 312 is provided between the photodiode (PD) 200 and the FD part 210, and a contact 313 is provided at an end portion of the transfer gate electrode 312.

A reset gate electrode 321, an amplifying gate electrode 322, and an address gate electrode 323 are provided in that order in the bent band-shaped region 320. Contacts 324, 325, and 326 are provided at end portions of the gate electrodes 321, 322, and 323, respectively. The contact 311 of the FD part 210 and the contact 325 of the amplifying gate electrode 322 are connected by metal wiring within the pixel.

A contact 327 connected to the resetting Vdd is provided between the reset gate electrode 321 and the amplifying gate electrode 322. A contact 328 connected to the vertical signal line 260 is provided at an end portion of the bent band-shaped region 320.

FIG. 4 shows metal wiring in a layer higher than that of FIG. 3 and contacts therebetween in conjunction with active regions. This example has three layers of metal wiring. A first layer is used as intra-pixel wiring 330; a second layer is used as wiring 340 in a vertical direction; and a third layer is used as wiring 350 in a horizontal direction.

Conventionally, these pieces of metal wiring 330, 340, and 350 are disposed so as to avoid the photodiode region. This example greatly differs in that the metal wiring is provided also on the upper side (that is, a surface opposite from an incidence plane) of the photodiode. Clearly, with the conventional wiring method in which the wiring avoids the photodiode, it is not possible to lay out a pixel of a size as shown in the figures.

The above configuration is common with the prior application described above. A configuration of the rear surface incidence type image pickup pixel unit characteristic of the present embodiment will be described in the following.

A first embodiment of the present invention will be described.

Figure 5:
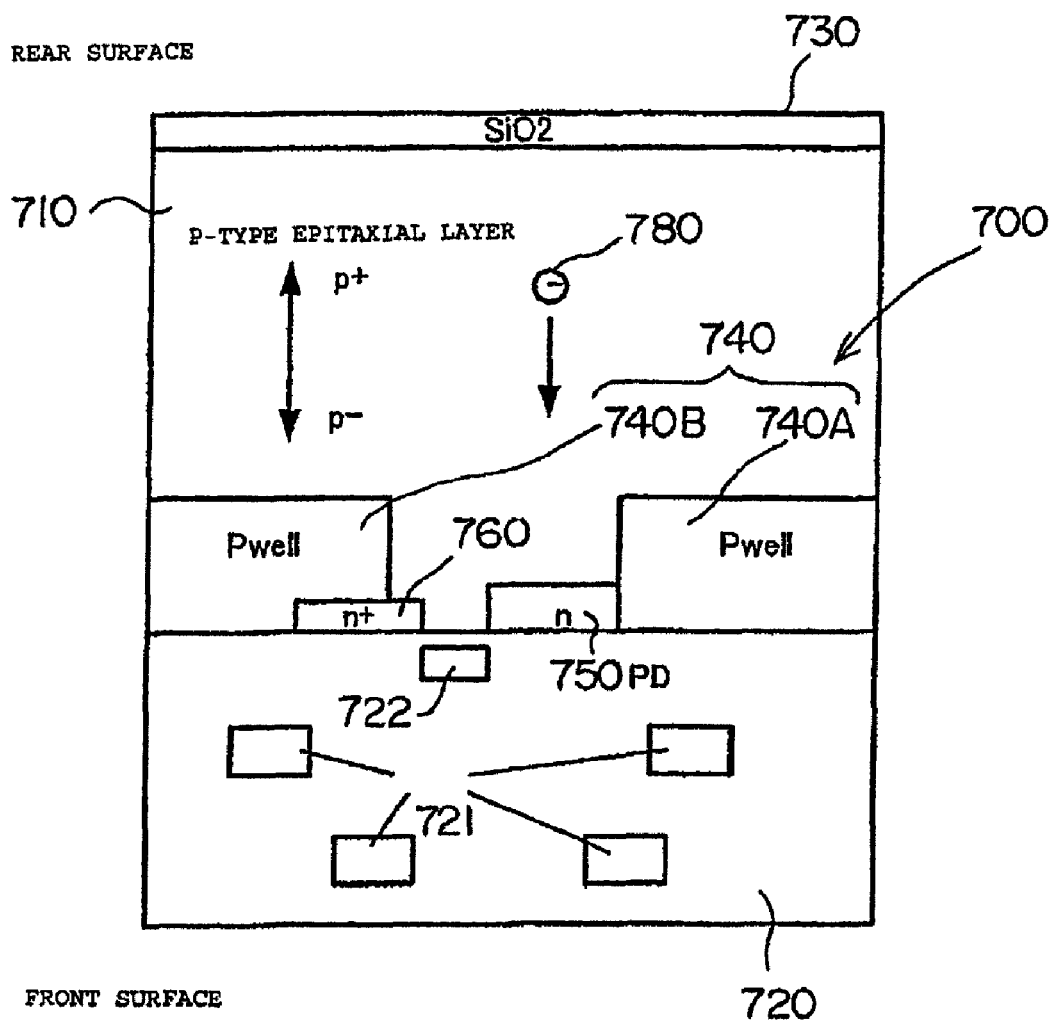
FIG. 5 is a sectional view of a device structure in a rear surface incidence type CMOS image sensor according to a first embodiment of the present invention.
Figure 6:
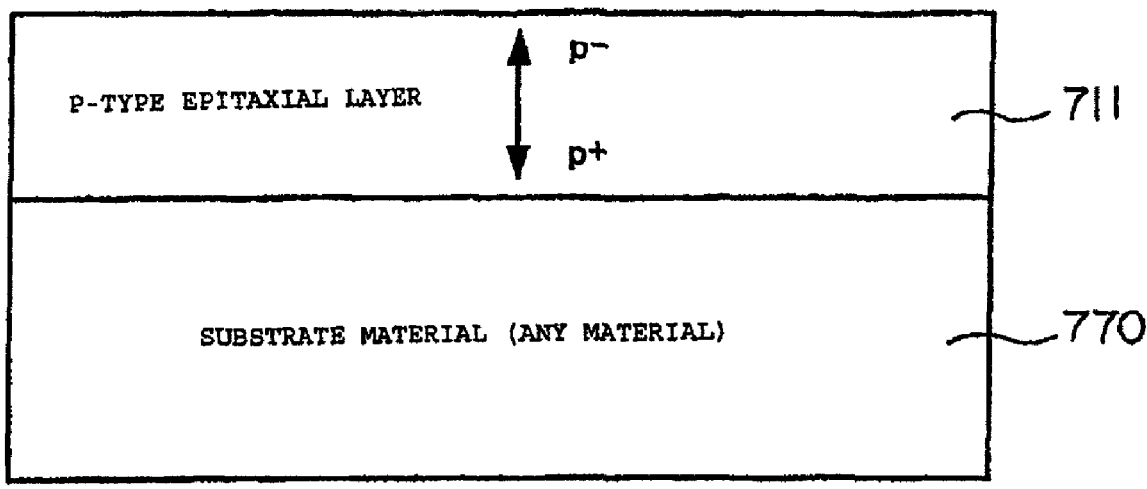
FIG. 6 is a sectional view of an epitaxial substrate used in the CMOS image sensor shown in FIG. 5.

FIG. 5 is a sectional view of a device structure in a rear surface incidence type CMOS image sensor according to the first embodiment of the present invention, showing structure of a photodiode and a transfer gate within one pixel 700 of the image pickup pixel unit. In FIG. 5, an upper part is an incidence plane (rear surface) side and a lower part is a wiring plane (front surface) side. FIG. 6 is a sectional view of an example of an epitaxial substrate used as a semiconductor substrate (device forming layer) in the CMOS image sensor shown in FIG. 5.

As shown in FIG. 5, the CMOS image sensor in this example has a wiring layer 720 formed on a surface of an epitaxial substrate 710. Within the wiring layer 720, various wiring 721 formed by multilayer interconnection, a gate electrode 722 of a transfer transistor and the like are provided with an intermediate insulating layer.

A silicon oxide film (SiO2) 730 is formed on the rear surface of the epitaxial substrate 710 to form a light incidence plane. Though omitted in FIG. 5, a light shield film, a color filter, a microlens and the like are provided in a layer over the silicon oxide film 730.

A P-type well region 740 as a device forming region is formed in a shallow region on the front surface side of the epitaxial substrate 710. The P-type well region 740 includes an n-type region 750 as a photoelectric converting region of the photodiode and an n+ type region 760 of an FD part. The gate electrode 722 of the transfer transistor operates to output signal charge accumulated in the n-type region 750 of the photodiode to the n+ type region 760 of the FD part.

As shown in FIG. 5, the n-type region 750 of the photodiode and the n+ type region 760 of the FD part are formed in the shallow region from the front surface side of the epitaxial substrate 710. The P-type well region 740 is removed in a lower region (a region on the rear surface side) that extends from the n-type region 750 of the photodiode to the n+ type region 760 of the FD part. A P− type epitaxial layer of the epitaxial substrate 710 is disposed in the portion of the lower region (therefore, in the section shown in FIG. 5, the P-type well region 740 is formed as two separate P-type well regions 740A and 740B).

The epitaxial substrate 710 has an epitaxial layer of a relatively high-concentration P+ type in a deep region (a region on the rear surface side) of the substrate 710 and of a relatively low-concentration P− type in a shallow region (a region in the vicinity of the photodiode on the front surface side) of the substrate 710 as a result of adjustment of impurity concentration by ion implantation or the like.

Thus in this example, a concentration gradient (from the P+ type to the P− type) is provided in advance in a direction of depth of the epitaxial substrate 710, whereby an electric field is formed in a fixed manner.

A method of fabricating the device structure shown in FIG. 5 will next be described with reference to FIG. 6. It is to be noted that the epitaxial substrate 710 in FIG. 5 is turned upside down in FIG. 6.

First, a P-type epitaxial layer 711 is grown on a surface of a substrate material 770 such as a P-type semiconductor substrate or the like. The P-type epitaxial layer 711 is formed such that the impurity concentration thereof is lowered with upward approach (to the surface) in FIG. 6. Incidentally, any material may be used as the substrate material 770 as long as the substrate material 770 allows epitaxial growth.

Using such a substrate (the composite substrate of the substrate material 770 and the P-type epitaxial layer 711), each device such as the transistor, the photodiode, the wiring or the like is created in the surface of the P-type epitaxial layer 711. Thereafter, the substrate is turned upside down, the substrate material 770 side is ground to remove the substrate material 770, and further the P-type epitaxial layer 711 is polished to a predetermined film thickness, whereby the above-described epitaxial substrate 710 is formed. Then, the silicon oxide film 730 is formed on the rear surface of the epitaxial substrate 710, and further the light shield film, the color filter, the microlenses and the like are provided.

The first embodiment as described above eliminates the need for fabricating a deep P-type well region 740 in the image pickup pixel unit, and thus makes the fabrication easier. The first embodiment has another advantage in that identical well regions can be used as the P-type well region of the image pickup pixel unit and a P-type well region of a peripheral circuit unit.

Specifically, in this example, an electric field is generated within the P-type epitaxial substrate 710 due to a concentration difference thereof, whereby the electric field leads an electron (indicated as an electron 780 in FIG. 5) generated by photoelectric conversion of incident light in the P-type epitaxial substrate 710 to the photodiode (PD) side. Hence, even with the shallow P-type well region, it is possible to prevent the electron from entering adjacent pixels.

Incidentally, a hole generated by the photoelectric conversion in conjunction with the electron is led to the rear surface side by the electric field. Holes as a whole are maintained in a uniform state at all times as a result of diffusion between the rear surface and the P-type well region.

In this case, the epitaxial layer is made to change from the P+ type on the rear surface side to the P− type; however, other gradients may be used as long as the impurity distribution causes an electric field in the same direction within the epitaxial layer. For example, a P-type to I (=intrinsic)-type distribution, a P-type to N-type distribution, or an I-type to N-type distribution may be used. Also, while in this case, the substrate material 770 is ground to be removed completely, the substrate material 770 does not necessarily need to be removed when the substrate material 770 sufficiently transmits light of waveforms of interest.

Figure 7:
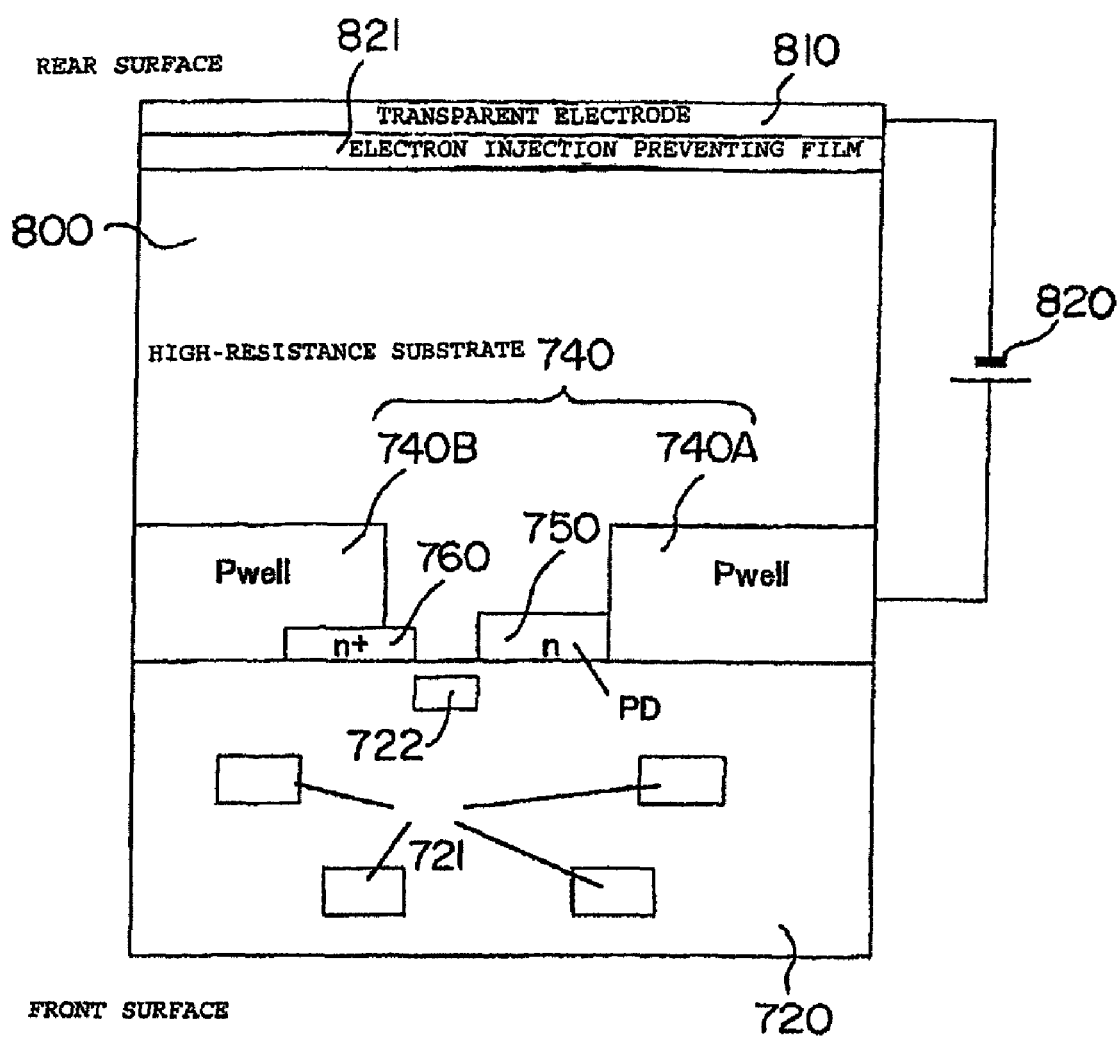
FIG. 7 is a sectional view of a device structure in a rear surface incidence type CMOS image sensor according to a second embodiment of the present invention.

A second embodiment of the present invention will next be described. FIG. 7 is a sectional view of a device structure in a rear surface incidence type CMOS image sensor according to the second embodiment of the present invention, showing structure of a photodiode and a transfer gate within one pixel 700 of an image pickup pixel unit. In FIG. 7, an upper part is an incidence plane (rear surface) side and a lower part is a wiring plane (front surface) side. Components common with FIG. 5 are identified by the same reference numerals, and description thereof will be omitted.

As shown in FIG. 7, the CMOS image sensor in this example is provided with an electrode 810 on the rear surface of a substrate 800 in which a photodiode and a P-type well region are created. An electric field is generated within the substrate 800 by sending a current from a power supply 820 to the electrode 810.

In the example shown in FIG. 7, a transparent electrode 810 of ITO (indium-tin oxide) or the like is used. The transparent electrode 810 is disposed in a light receiving region of the substrate 800 and supplied with a minus voltage relative to the P-type well region 740.

Thereby an electric field in a direction in which photoelectrons drift to the photodiode is generated, thus making it difficult for the photoelectrons to enter adjacent pixels. Hence a shallow P-type well region 740 is allowed to be formed. Incidentally, holes generated by the photoelectric conversion in conjunction with the electrons are drifted to the transparent electrode 810 side and absorbed.

In this example, it is desirable to use a high-resistance substrate close to an intrinsic semiconductor for the substrate 800. This makes it possible to sufficiently reduce a current flowing from the P-type well region 740 and the like to the transparent electrode 810 on the rear surface. Specifically, a substrate with a difference between a donor and an acceptor concentration of $10^{13}$ cm$^{-3}$ or less is desirable (of course this includes the intrinsic semiconductor). However, this indicates a substrate of a concentration now scarcely used in semiconductor ICs.

It is also desirable to dispose an electron injection preventing film 821 between the transparent electrode 810 and the substrate 800 in order to prevent electrons from being injected from the transparent electrode 810 into the substrate 800. Incidentally, as the electron injection preventing film 821, a shallow P+ layer may be formed, or a semiconductor layer of amorphous silicon carbide or the like with a large band gap may be formed.

When the electron injection preventing film 821 is provided, an n- type high-resistance substrate may be used. Specifically, a substrate with a donor concentration of $10^{15}$ cm$^{-3}$ or less is desirable. However, this concentration indicates a low level scarcely used in current semiconductor ICs. Further, even without such an electron injection preventing film 821, it suffices for the transparent electrode itself to have a work function on the P side.

Figure 8:
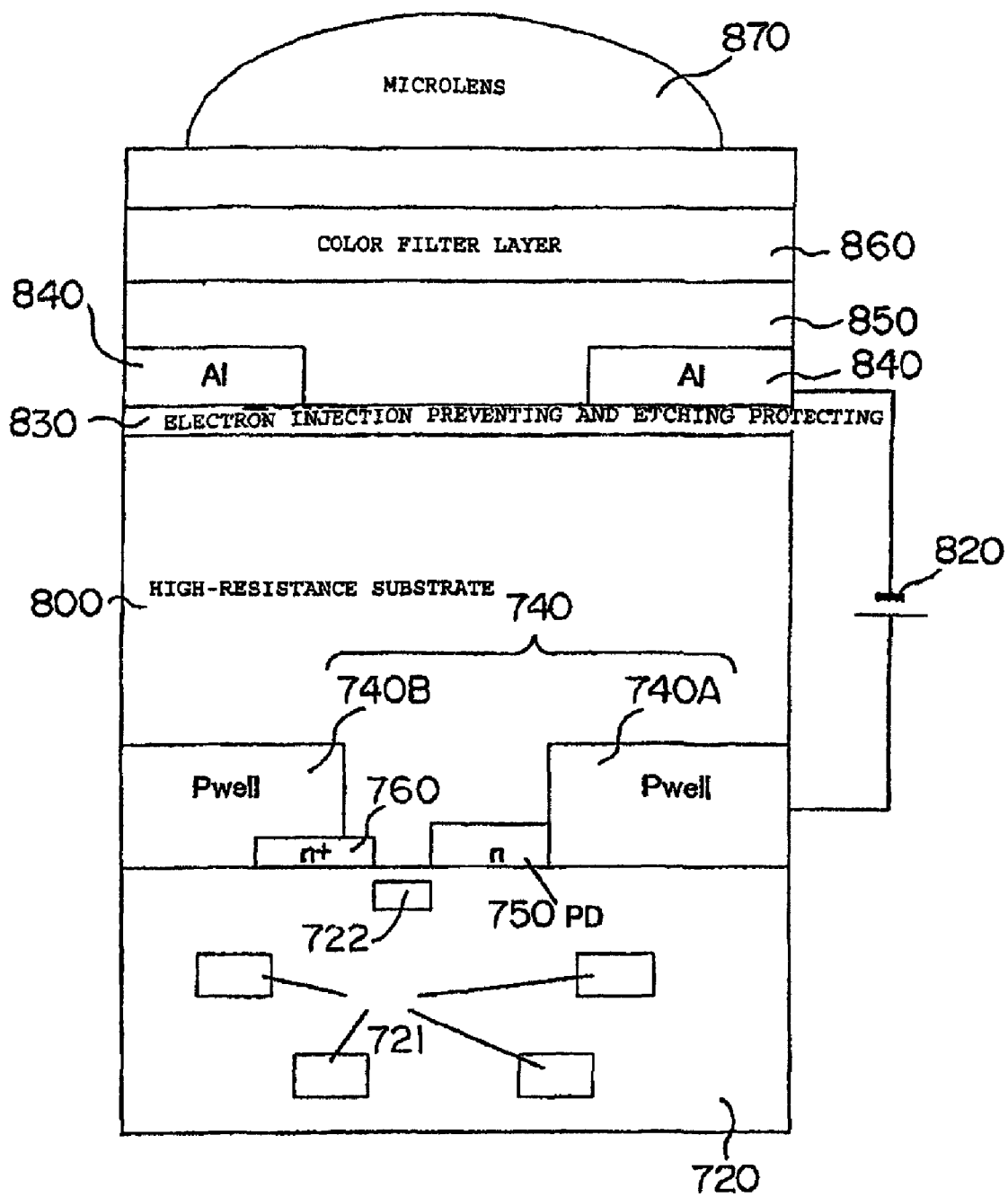
FIG. 8 is a sectional view of a device structure in a rear surface incidence type CMOS image sensor according to a third embodiment of the present invention.

A third embodiment of the present invention will next be described. FIG. 8 is a sectional view of a device structure in a rear surface incidence type CMOS image sensor according to the third embodiment of the present invention, showing structure of a photodiode and a transfer gate within one pixel 700 of an image pickup pixel unit. In FIG. 8, an upper part is an incidence plane (rear surface) side and a lower part is a wiring plane (front surface) side. Components common with FIG. 5 and FIG. 7 are identified by the same reference numerals, and description thereof will be omitted.

As shown in FIG. 8, the CMOS image sensor in this example is provided with a metal electrode 840 of Al or the like on the rear surface of a substrate 800 in which a photodiode and a P-type well region are created, with an insulative protecting film 830 intermediate between the substrate 800 and the metal electrode 840. An electric field is generated within the substrate 800 by sending a current from a power supply 820 to the metal electrode 840.

The metal electrode 840 is disposed so as to avoid a light receiving region in the substrate 800, and surrounded by the insulative protecting film 830 and an upper insulating film 850. A color filter 860 and a microlens 870 are disposed on the upper insulating film 850.

Thereby an electric field in a direction in which electrons drift to the photodiode is generated, thus making it difficult for the photoelectrons to enter adjacent pixels. Hence a shallow P-type well region 740 is allowed to be formed. Incidentally, holes generated by the photoelectric conversion in conjunction with the electrons are drifted to the metal electrode 840 side and absorbed.

In this example, since the metal electrode 840 is disposed so as to avoid the light receiving region, the metal electrode 840 can also be used as light shield film for blocking light passing through an edge portion of the color filter formed for each pixel and for providing a pixel in which the whole of the light receiving region is intentionally shielded from light to detect a black level.

FIG. 8 shows the color filter 860 and the microlens 870 to clearly illustrate the arrangement of the metal electrode 840; the structure itself of the color filter 860 and the microlens 870 is not particularly different from that of the foregoing examples.

Also in this example, it is desirable to use a high-resistance substrate or an n– substrate as the substrate for the same reasons as described above. It is also desirable to provide an electron injection preventing film (insulative protecting film 830) between the electrode 840 on the rear surface and the substrate 800. Incidentally, the electron injection preventing film is described as the insulative protecting film 830 because the electron injection preventing film also functions as a protecting film when the electrode on the rear surface is etched.

A method of mounting the solid-state image pickup device in this example will next be described. Since the electrode is provided on the rear surface of the substrate in the foregoing examples of FIG. 7 and FIG. 8, the method of mounting the solid-state image pickup device in a package or the like provides a structure as shown in FIG. 9.

Figure 9:
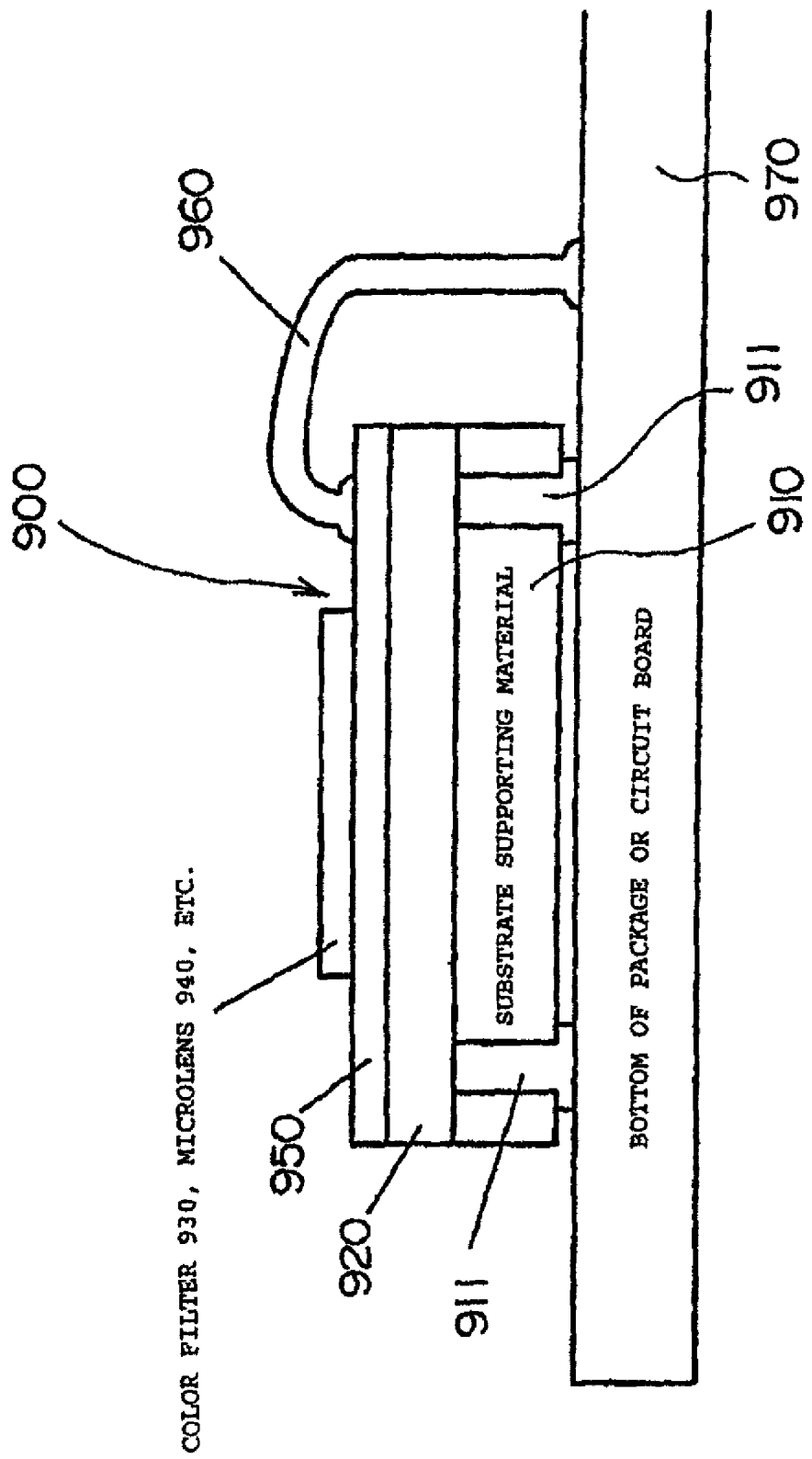

Specifically, the solid-state image pickup device 900 shown in FIG. 9 provided with a main device unit (the semiconductor substrate and the wiring layer portion) 920 as shown in FIG. 7 or FIG. 8 on a substrate supporting material 910 is flip-chip-mounted on a bottom board of the package or a circuit board 970.

A rear-surface electrode 950 as described above is provided on top (rear surface side) of the main device unit 920, and a color filter 930 and a microlens 940 are provided on top of the rear-surface electrode 950. Incidentally, though not shown, a lens barrel is mounted such that the lens is situated over such a mounted structure.

Figure 12:
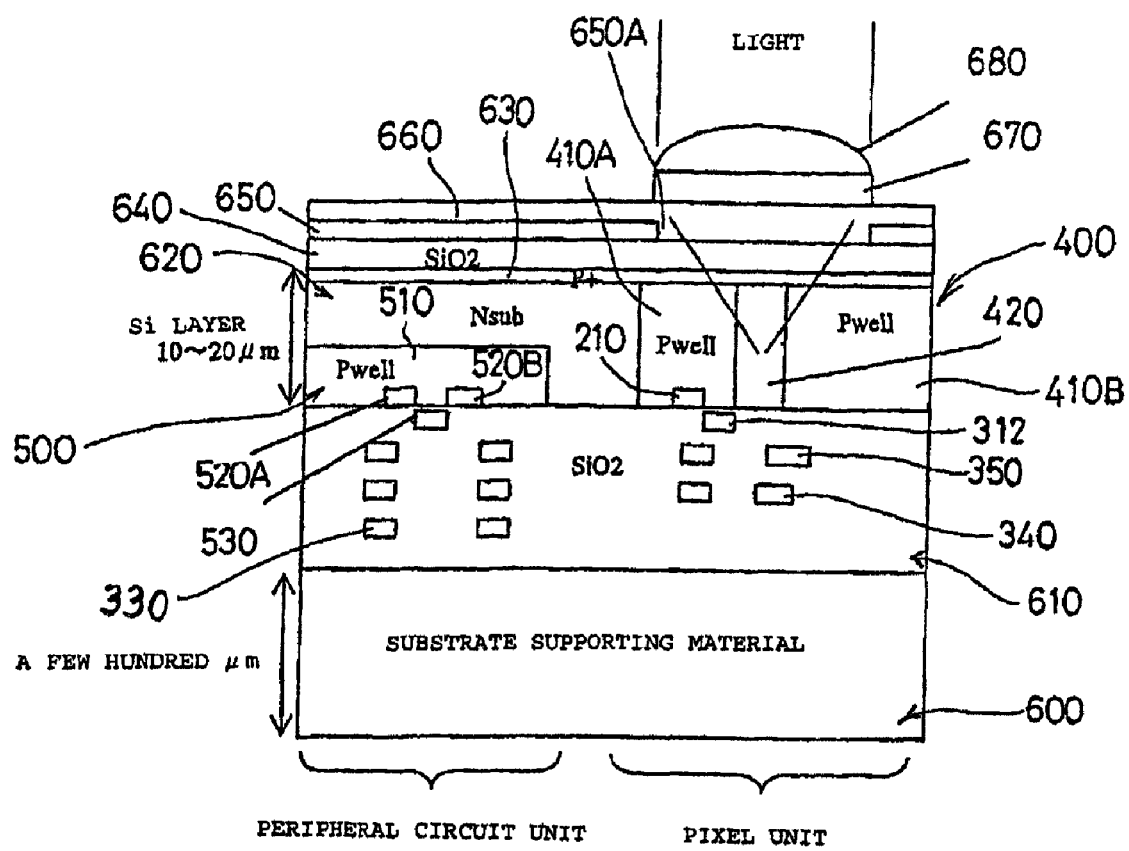
FIG. 12 is a sectional view of a structure of a rear surface incidence type CMOS image sensor according to a prior application.

As in the foregoing solid-state image pickup device of the prior application (FIG. 12), the substrate supporting material 910 is provided on the front surface of the substrate so as to maintain a certain degree of strength even when the substrate is thinned by polishing the rear surface thereof. The main device unit 920 is connected to the bottom board of the package or the circuit board 970 by contact wiring 911 provided within the substrate supporting material 910. The rear-surface electrode 950 is connected to the bottom board of the package or the circuit board 970 via wire bonding 960.

Desirable forms of the P-type well region in the solid-state image pickup device in this example will next be described. In both of the foregoing examples of FIG. 7 and FIG. 8, the electric field in the direction in which electrons drift to the photodiode (PD) is formed within the semiconductor substrate.

Figure 10:
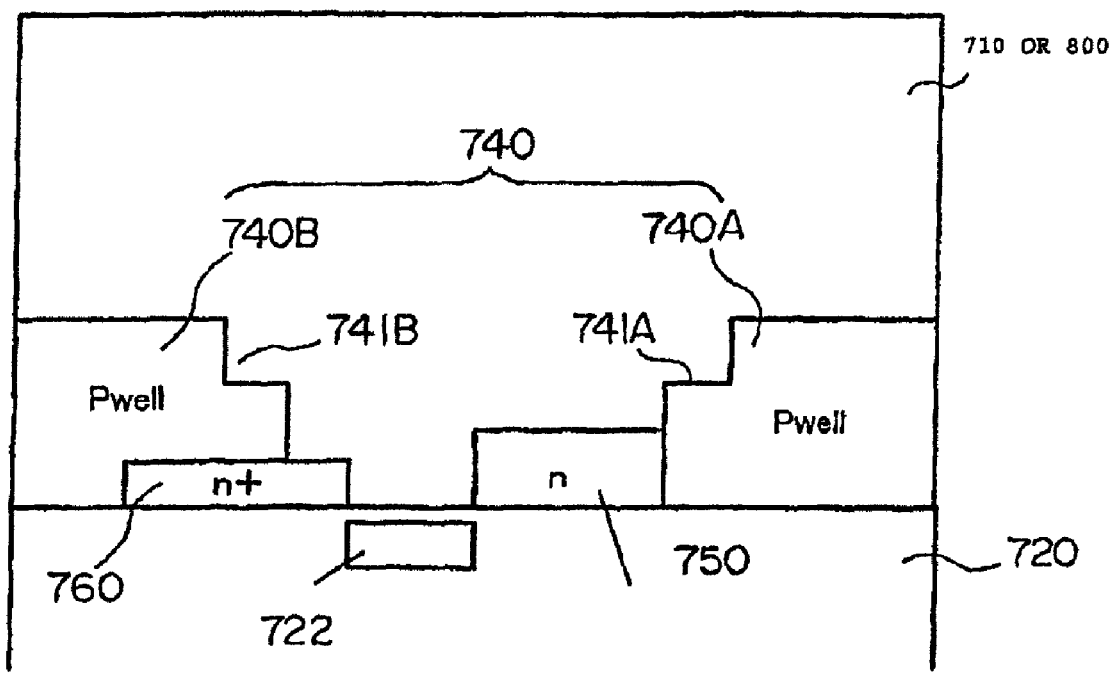
FIG. 10 is a sectional view of a desirable mode of a P-type well region in the CMOS image sensor shown in FIG. 5, FIG. 7, and FIG. 8.
Figure 11:
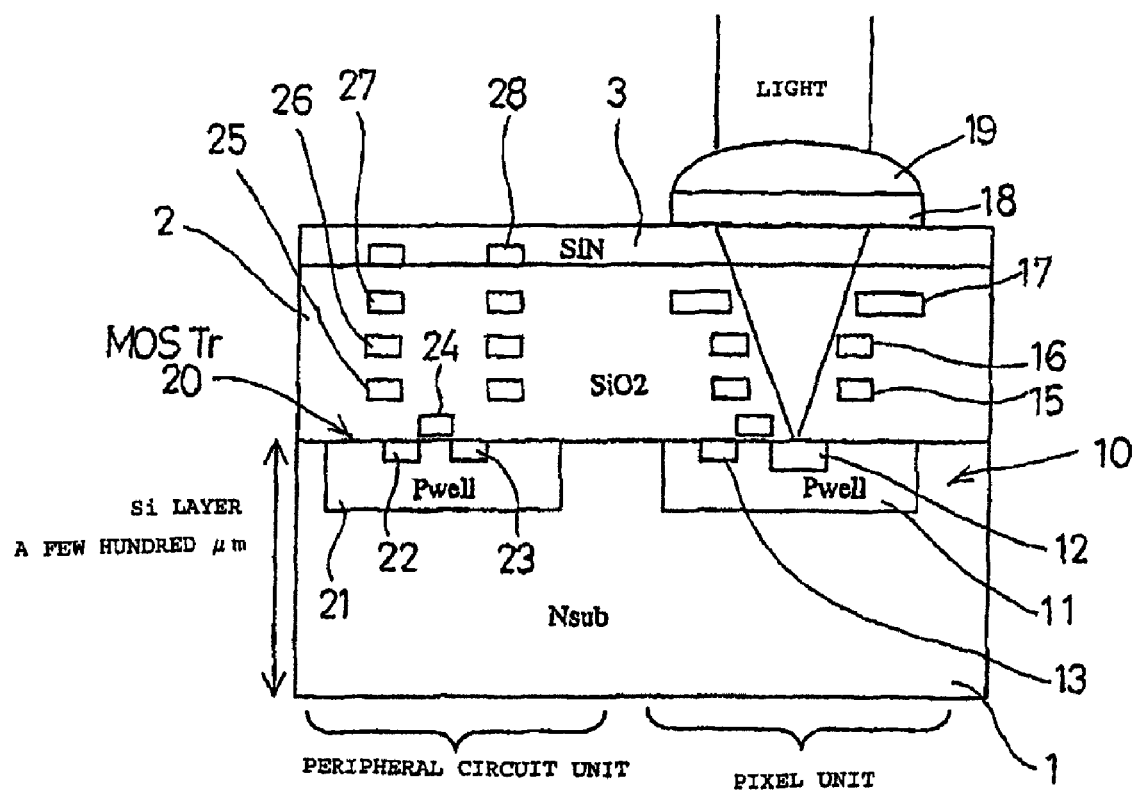
FIG. 11 is a sectional view of a structure of a conventional CMOS image sensor.

As a desirable mode of the P-type well region 740 common to these examples, there is a form as shown in FIG. 10, for example. Specifically, the P-type well region is not formed at the photodiode (PD; n-type region 750), and an opening 741A and 741B of the P-type well regions 740A and 740B on both sides is made larger at a part nearer to the rear surface. Thereby an electric field is formed so as to facilitate flow of electrons into the photodiode.

As a method of creating such a shape of the P-type well region, when the P-type well region is formed by implanting ions to different depths by a plurality of ion implantations, for example, a method of performing ion implantation to a deep portion in a separate step using a separate mask can be used.

Further, as another desirable mode, reflection preventing film is attached to an upper and a lower surface and sides of the wiring to prevent irregular light reflection, or a material with a high light absorptance is used in the substrate supporting material and the bottom board of the package or the circuit board.

As described above, with the solid-state image pickup device according to the embodiments, in the rear surface incidence type CMOS image sensor, an electric field leading electrons to the photodiode side is formed in the semiconductor substrate part. It is therefore possible to provide an excellent solid-state image pickup device with a little color mixing and a little decrease in resolution without forming the P-type well region deep enough to reach the rear surface.

Thus, a difficult production process such as reducing the semiconductor substrate part to a very small thickness equal to the depth of the P-type well region is not required, and hence stable fabrication can be realized. Further, even when the pixel is made smaller, the photodiode does not need to be made very long and narrow in the direction of depth thereof.

It is therefore not necessary to reduce the thickness of the semiconductor substrate part in correspondence with the smaller pixel. Thus, reduction in size of the pixel can be promoted without problems, and reduction in size of the chip can also be realized.

It is to be noted that while in the foregoing embodiments, the solid-state image pickup device as a separate unit has been described, such a solid-state image pickup device can be incorporated into various electronic apparatus such as various digital camera apparatus, and portable telephones and various other communication apparatus to contribute to reduction in size and increase in performance of the electronic apparatus, and therefore the present invention covers such electronic apparatus.

As described above, with the solid-state image pickup device and the method of fabricating the same according to the present invention, electric field generating means is provided which generates an electric field in the semiconductor substrate in the direction of depth of the semiconductor substrate and thereby leads photoelectrons entering from the second surface (light receiving plane) of the semiconductor substrate to the photoelectric converting device formed on the first surface side of the semiconductor substrate. Therefore, even when the photoelectric converting device and the well region are formed in a shallow region on the first surface side of the semiconductor substrate, photons entering from the second surface of the semiconductor substrate can be effectively led to the photoelectric converting device. It is thereby possible to control decrease in sensitivity and color mixing.

Thus, the thickness of the semiconductor substrate does not need to coincide with the depth of the photoelectric converting device and the well region, the semiconductor substrate can therefore be formed with proper thickness, and the photoelectric converting device and the well region can be formed easily. It is thereby possible to provide a rear surface incidence type solid-state image pickup device that is simple, low in cost, and excellent in picture quality.

Further, by incorporating such a solid-state image pickup device into an electronic apparatus, the electronic apparatus can be reduced in size.

I claim:

1. A solid-state image pickup device comprising:
   a channel region of a first conductivity-type between a photoelectric converting region of a second conductivity-type and a floating diffusion part of the second conductivity-type, a portion of a wiring layer being between a gate electrode and said channel region;
   wherein said floating diffusion part and said photoelectric converting region have differing dopant concentrations of the second conductivity-type, said dopant concentration for the floating diffusion part being greater than said dopant concentration for the photoelectric converting region;
   wherein the photoelectric converting device is configured to generating a signal charge corresponding to an amount of light, an output of said signal charge from said photoelectric converting region to said floating diffusion part being controllable by said gate electrode;
   wherein said light is transmissible through a light incidence plane into an epitaxial layer,
   said epitaxial layer between said wiring layer and said light incidence plane;
   wherein a dopant concentration of the first conductivity-type for said epitaxial layer decreases along a direction from said light incidence plane toward said wiring layer.

2. A solid-state image pickup device as claimed in claim 1, wherein said photoelectric converting region and said floating diffusion part are in physical contact with said wiring layer.

3. A solid-state image pickup device as claimed in claim 1, wherein said wiring layer is an insulating layer.

4. A solid-state image pickup device as claimed in claim 1, wherein said floating diffusion part and said photoelectric converting are source/drain regions of a transistor, said transistor including said gate electrode and said channel region.

5. A solid-state image pickup device as claimed in claim 1, wherein said epitaxial layer is an epitaxial substrate.

6. A solid-state image pickup device as claimed in claim 1, wherein said light incidence plane is a silicon oxide film, said silicon oxide film being in physical contact with said epitaxial layer.

7. A solid-state image pickup device as claimed in claim 1, wherein a portion of the epitaxial layer is said channel region.

8. A solid-state image pickup device as claimed in claim 1, wherein well regions of the first conductivity-type are within said epitaxial layer, said photoelectric converting region being between one of the well regions and said channel region.

9. A solid-state image pickup device as claimed in claim 8, wherein a portion of the floating diffusion part is within another of the well regions, another portion of the floating diffusion part not being within said another of the well regions.

10. A solid-state image pickup device as claimed in claim 1, wherein a conductivity type for said epitaxial layer differs along a direction from said wiring layer toward said light incidence plane.

11. A solid-state image pickup device as claimed in claim 1, wherein a conductivity type for said epitaxial layer is from the group consisting of said first conductivity-type, an intrinsic conductivity-type, and said second conductivity-type.

12. A solid-state image pickup device as claimed in claim 11, wherein said conductivity type changes from said first conductivity-type to an intrinsic conductivity-type.

13. A solid-state image pickup device as claimed in claim 11, wherein said conductivity type changes from said first conductivity-type to said second conductivity-type.

14. A solid-state image pickup device as claimed in claim 11, wherein said conductivity changes from an intrinsic conductivity-type to said second conductivity-type.

15. A solid-state image pickup device as claimed in claim 1, wherein said first conductivity-type is P-type and said second conductivity-type is N-type.

* * * * *